US006989595B2

United States Patent
Hofmann (10) Patent No.: US 6,989,595 B2
(45) Date of Patent: Jan. 24, 2006

(54) MOLDS CONFIGURED TO PATTERN MASSES ASSOCIATED WITH SEMICONDUCTOR CONSTRUCTIONS

(75) Inventor: James J. Hofmann, Boise, ID (US)

(73) Assignee: Micron Technology, Inc., Boise, ID (US)

(*) Notice: Subject to any disclaimer, the term of this patent is extended or adjusted under 35 U.S.C. 154(b) by 50 days.

(21) Appl. No.: 10/461,811

(22) Filed: Jun. 12, 2003

(65) Prior Publication Data

US 2004/0214440 A1 Oct. 28, 2004

Related U.S. Application Data

(62) Division of application No. 10/099,840, filed on Mar. 12, 2002, now Pat. No. 6,716,754.

(51) Int. Cl.
*H01L 23/34* (2006.01)

(52) U.S. Cl. .................. 257/719; 257/791
(58) Field of Classification Search ............... 257/719, 257/791, 776, 797
See application file for complete search history.

(56) References Cited

U.S. PATENT DOCUMENTS

| | | | |
|---|---|---|---|
| 5,348,616 A * | 9/1994 | Hartman et al. ............... 216/48 |
| 5,527,586 A | 6/1996 | Schuler et al. ............... 428/164 |
| 5,597,613 A | 1/1997 | Galarneau et al. | |
| 5,658,575 A | 8/1997 | Ribier et al. | |
| 5,735,985 A | 4/1998 | Ghosh et al. | |
| 6,110,401 A | 8/2000 | Lee et al. | |
| 6,190,929 B1 | 2/2001 | Wang et al. | |
| 6,225,143 B1 | 5/2001 | Rao et al. | |
| 6,309,580 B1 * | 10/2001 | Chou ............... 264/338 |
| 6,482,742 B1 * | 11/2002 | Chou ............... 438/690 |
| 6,517,995 B1 * | 2/2003 | Jacobson et al. ............... 430/320 |
| 6,580,172 B2 * | 6/2003 | Mancini et al. ............... 257/762 |
| 6,716,754 B2 | 4/2004 | Hofmann ............... 438/690 |

OTHER PUBLICATIONS

"Information About HS II RTV High Strength Moldmaking Silicone Rubber Product Line" Down Corning: 1992.
"Large scale nanolithography using nanoimprint lithography"; Babak Heidari, Ivan Maximov, Eva–Lena Sarwe, and Lars Montelius; J.Vac.Sci. Techol. B17(6), Nov./Dec. 1999; 1999 American Vacuum Society; pp. 2961–2964.
Website: http://www.dow.com/cyclotene/prods/prod1.htm: Cyclotene: Photosensitive Resins; May 14, 2001.
Website: http://www.dow.com/cyclotene/apps/app11.htm: Cyclotene: Bumping/Redistribution/Wafer Level Packaging (WLP); May 14, 2001.
Website: http://www.dow.com/cyclotene/apps/app13.htm: Cyclotene: Multilayer Interconnects; May 14, 2001.
Website: http://www.dow.com/cyclotene/over.htm: Cyclotene: BCB Properties; May 14, 2001.
Website: http://www.dow.com/cyclotene/over/tg.htm: Tg vs Cure; May 14, 2001.
"New polymer materials for nanoimprinting"; H. Schulz et al.;J. Vac. Sci. Techol. B18(4) Jul./Aug. 2000; pp. 1861–1865.

* cited by examiner

Primary Examiner—David Nelms
Assistant Examiner—Quoc Hoang
(74) Attorney, Agent, or Firm—Wells St. John P.S.

(57) ABSTRACT

The invention includes methods of forming patterns in low-k dielectric materials by contact lithography. In a particular application, a mold having a first pattern is pressed into a low-k dielectric material to form a second pattern within the material. The second pattern is substantially complementary to the first pattern. The mold is then removed from the low-k dielectric material. The invention also includes a method of forming a mold; and includes a mold configured to pattern a mass over a semiconductor substrate during contact lithography of the mass.

9 Claims, 7 Drawing Sheets

MOLDS CONFIGURED TO PATTERN MASSES ASSOCIATED WITH SEMICONDUCTOR CONSTRUCTIONS

RELATED PATENT DATA

This patent resulted from a divisional application of U.S. patent application Ser. No. 10/099,840, which was filed Mar. 12, 2002 now U.S. Pat. No. 6,716,754.

TECHNICAL FIELD

The invention pertains to methods of forming patterns for semiconductor constructions, and in particular applications pertains methods of utilizing contact lithography for forming patterns. The invention also encompasses molds configured to pattern masses associated with semiconductor constructions.

BACKGROUND OF THE INVENTION

Figure 1:
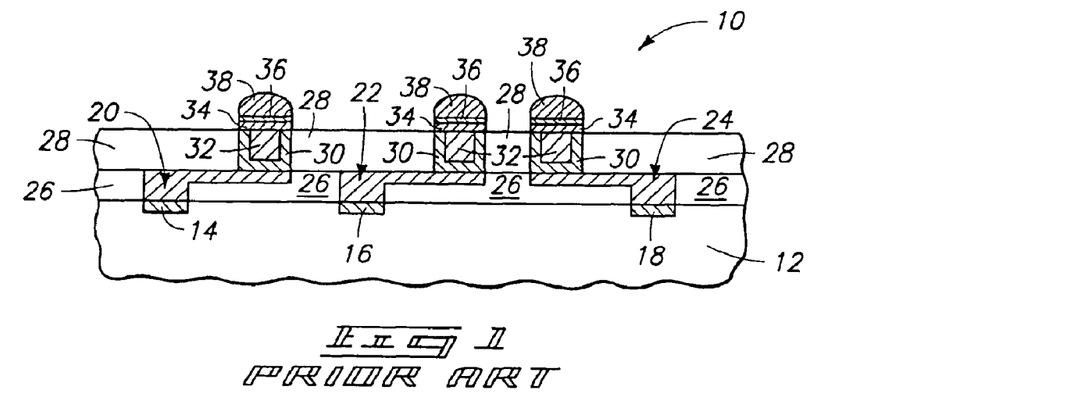
FIG. 1 is a diagrammatic, cross-sectional, fragmentary view of a prior art semiconductor wafer construction.

A prior art semiconductor construction 10 is described with reference to FIG. 1. Construction 10 comprises a substrate 12 having a plurality of conductive pads 14, 16 and 18 supported thereover. Pads 14, 16 and 18 can comprise various conductive materials, including, for example, copper and/or aluminum. Substrate 12 can comprise, for example, a monocrystalline silicon wafer having a plurality of circuit constructions (not shown), such as memory or logic constructions, supported thereon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Pads 14, 16 and 18 correspond to electrical interconnects which join the various circuitry (not shown) associated with substrate 12 to electrical components (not shown) external of substrate 12. Substrate 12 can be considered an integrated circuit component, and pads 14, 16 and 18 can correspond to, for example, bonding pads or so-called Level III wiring.

Pads 14, 16 and 18 can be considered to comprise or define electrical nodes. Presently, efforts are underway to redistribute electrical connections from bonding pads to other regions of semiconductor circuitry. The redistribution of the electrical connections can simplify electrical connection of integrated circuitry associated with a semiconductor construction to other circuitry which is external of the semiconductor construction. FIG. 1 illustrates a plurality of redistribution layers 20, 22, and 24 which are electrically connected with bonding pads 14, 16 and 18 respectively.

A dielectric material 26 separates redistribution layers 20, 22 and 24 from one another. Dielectric material 26 can comprise, for example, a so-called low-k dielectric material, with the term "low-k" referring to a dielectric material having a dielectric constant below 3.5. An exemplary low-k dielectric material is CYCLOTENE™, which is available from the Dow Chemical Company™. Redistribution layers 20, 22 and 24 can be referred to as Level IV wiring, and can comprise, for example, copper and/or aluminum.

An insulative material 28 is formed over redistribution layers 20, 22 and 24; and openings are formed through insulative material 28 to redistribution layers 20, 22, and 24. Subsequently, conductive materials 30 and 32 are formed within the openings. Conductive materials 30 and 32 can comprise, for example, a copper seed layer and sputter-deposited copper, respectively. After formation of layers 30 and 32, a pair of under bump metal layers 34 and 36 are provided, and subsequently solder bumps 38 are formed over the under bump layers and in electrical connection with redistribution layers 20, 22 and 24 through conductive materials 30 and 32. Under bump layers 34 and 36 can comprise, for example, nickel and gold, respectively; and solder bumps 38 can comprise, for example, tin-based solder. In further processing (not shown) solder bumps 38 can be connected with conductive materials external of construction 10 to electrically interconnect integrated circuitry associated with structure 10 to such external components.

Numerous difficulties are encountered in forming appropriate openings in insulative material 26 for redistribution layers 20, 22 and 24; and further problems are encountered in forming openings in insulative material 28 for conductive materials 30 and 32. It would be desirable to develop methodology which alleviates or eliminates such problems and difficulties.

SUMMARY OF THE INVENTION

In one aspect, the invention encompasses methods of forming patterns in low-k dielectric materials by contact lithography. In a particular application a mold having a first pattern is pressed into a low-k dielectric material to form a second pattern within the material. The second pattern is substantially complementary to the first pattern. The mold is then removed from the low-k dielectric material.

In another aspect, the invention encompasses a method of forming a mold. A template is provided which has a complement of a desired mold pattern thereover. The template is approximately the size of a semiconductor wafer and the desired mold pattern is a pattern utilized for contact lithography during semiconductor processing. A sheet having holes extending therethrough is provided. A mold material precursor is provided between the sheet and the template, and is pressed between the sheet and template. The mold material precursor is cured during the pressing to convert the precursor to a mold material having the desired mold pattern. The mold material penetrates through the openings in the sheet and is joined with the sheet to define a mold comprising the mold material and the sheet. The mold is subsequently removed from the template.

In another aspect, the invention encompasses a mold configured to pattern a mass over a semiconductor substrate during contact lithography of the mass. The mold includes a substantially rigid sheet having holes extending therethrough, and a patterned material joined to the sheet. The patterned material extends through the holes in the sheet, and has a pattern therein which is a reverse image of a pattern which is to be formed in the mass during contact lithography.

BRIEF DESCRIPTION OF THE DRAWINGS

Preferred embodiments of the invention are described below with reference to the following accompanying drawings.

FIG. 13 is a view of an initial step of a method of forming a mold in accordance with an embodiment of the present invention. Specifically, FIG. 13 illustrates a mold template, and an uncured mold material juxtaposed relative to the template.

DETAILED DESCRIPTION OF THE PREFERRED EMBODIMENTS

FIGS. 2–12 illustrate an exemplary method of forming a redistribution layer and electrical contacts to the redistribution layer in accordance with methodology of the present invention. In referring to FIGS. 2–12, similar numbering will be utilized as was used above in describing the prior art of FIG. 1.

Figure 2:
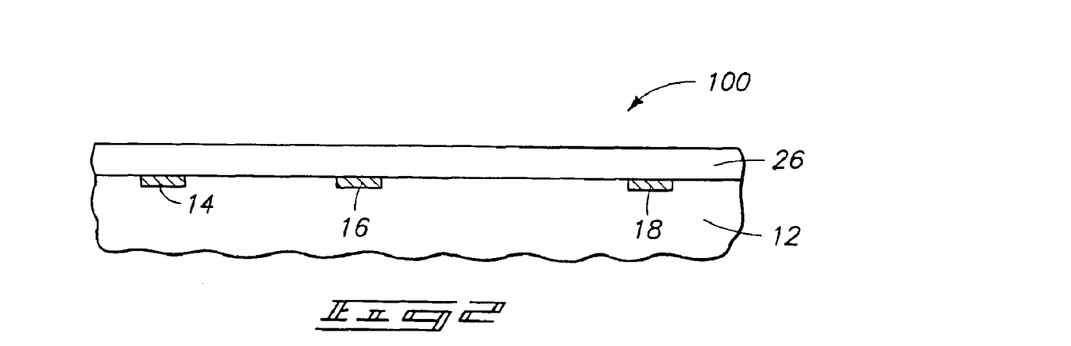
FIG. 2 is a diagrammatic, fragmentary, cross-sectional view of a semiconductor wafer construction at a preliminary processing step of a method of the present invention.

Referring initially to FIG. 2, a semiconductor construction 100 is illustrated in fragmentary view. Construction 100 comprises a substrate 12 having contact pads 14, 16 and 18 supported thereby. A low-k dielectric material 26 is provided over substrate 12. Low-k dielectric material 26 can comprise, for example, CYCLOTENE™. Material 26 can be referred to as a mass supported by substrate 12. Mass 26 can comprise a low-k polymer, consist of essentially of a low-k polymer, or consist of a low-k polymer. Mass 26 typically does not comprise, consist essentially of, or consist of photoresist.

Figure 3:
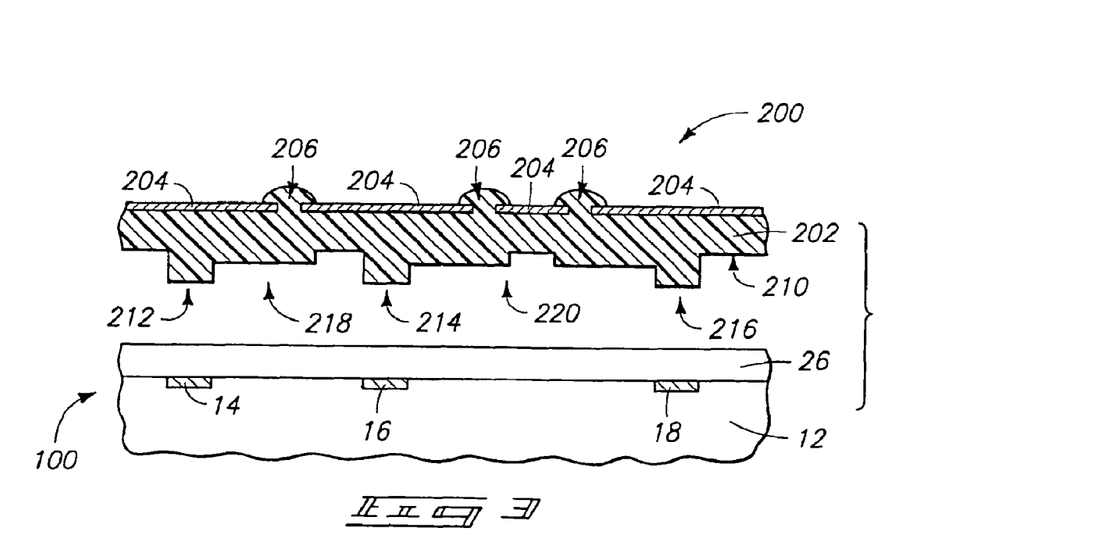
FIG. 3 is a view of the FIG. 2 wafer construction illustrated juxtaposed with a mold, in accordance with a processing step subsequent to that of FIG. 2.

Referring next to FIG. 3, apparatus 100 is shown juxtaposed relative to a mold 200. Mold 200 comprises a patterned material 202 and a sheet 204. Sheet 204 can comprise a substantially rigid material such as, for example, spring steel. In the shown embodiment, sheet 204 has openings 206 protruding therethrough, and patterned material 202 extends upwardly through the openings. A purpose of openings 206 will be described below with reference to exemplary processes for forming mold 200. Patterned material 202 can comprise, for example, a siloxane material, or a silicone rubber material, such as, for example, Dow Corning™ HS II RTV™ high strength mold making silicone rubber. Patterned material 202 can be a semi-solid material, such as a rubber or gel; or can be, for example, a thermoplastic material.

Patterned material 202 has a patterned lower surface 210. Patterned surface 210 defines a first pattern comprising projections 212, 214 and 216; and comprising valleys 218 and 220 between the projections. A lubricant or release layer (not shown) can be provided over lower surface 210 to enhance removal of mold 200 from within mass 26 in subsequent processing described below with reference to FIGS. 4 and 5.

Figure 4:
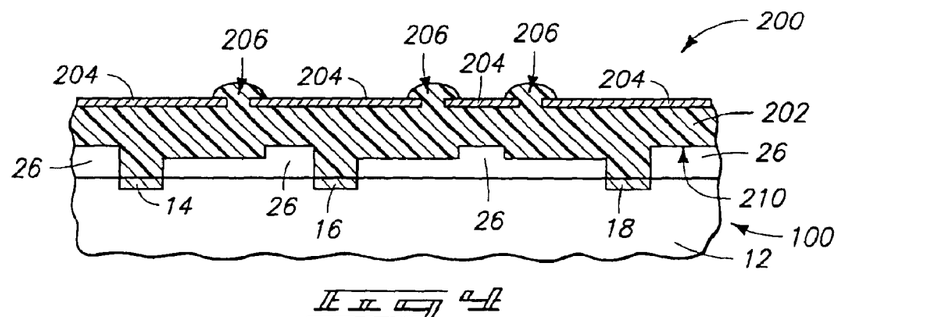
FIG. 4 is a view of the FIG. 2 wafer construction shown at a processing step subsequent to that of FIG. 2, and shown with the FIG. 3 mold pressed into the FIG. 2 wafer construction.

Referring to FIG. 4, mold 200 and construction 100 are pressed together to force a portion of patterned material 202 into mass 26. The pressing of mold 200 and construction 100 can be accomplished by moving either of mold 200 and construction 100 relative to the other of mold 200 and construction 100; or by moving both mold 200 and construction 100 relative to each other. The pressing effectively comprises pressing mass 26 between patterned material 200 and substrate 12. The pressing forms a second pattern within mass 26 which is substantially complementary to the first pattern defined by lower surface 210 of patterned material 202. The second pattern is referred to as being "substantially" complementary to indicate that the second pattern has a general shape corresponding to the compliment of the first pattern, but can have variations introduced due to, for example, imperfections in the uniformity of distribution of mass 26 about the interface of patterned material 202 and mass 26. Such imperfections can be caused by, for example, small gas bubbles.

Figure 5:
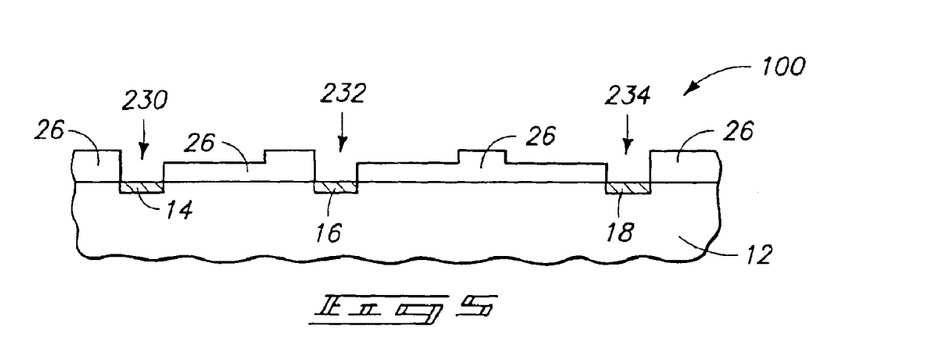
FIG. 5 is a view of the FIG. 2 wafer construction shown at a processing step subsequent to that of FIG. 4.

Referring to FIG. 5, mold 200 (FIG. 4) is removed from semiconductor construction 100 to leave the mass 26 patterned into the second pattern. The shown second pattern has openings 230, 232 and 234 extending through mass 26. Contact pads 14, 16 and 18 are exposed within openings 230, 232 and 234, respectively. It is noted that various chemical and/or plasma cleaning steps can be introduced to insure that conductive materials 14, 16 and 18 are well exposed within the openings 230, 232 and 234.

The patterning of mass 26 with mold 200 (FIGS. 3 and 4) can be referred to as contact lithography to indicate that such patterning occurred through compression of mass 26 with a mold, as opposed to other forms of lithography wherein patterning occurs via other mechanisms.

Figure 6:
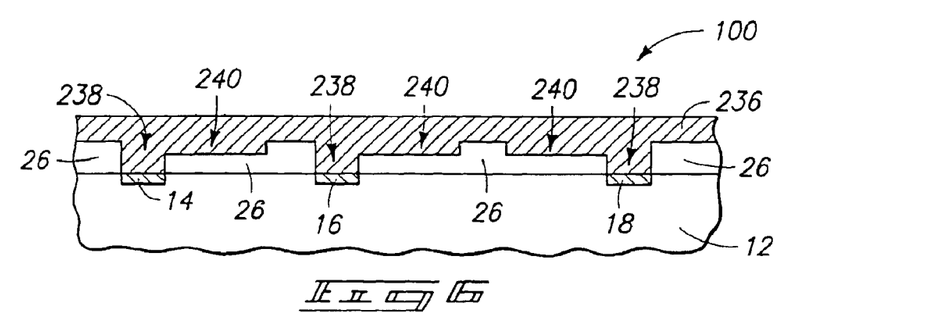
FIG. 6 is a view of the FIG. 2 wafer construction shown at a processing step subsequent to that of FIG. 5.

Referring to FIG. 6, a conductive material 236 is formed across the patterned mass 26. Conductive material 236 can comprise, for example, one or more metals, such as, for example, metals selected from the group consisting of copper, aluminum, tungsten and titanium. Additionally, an etch-stop layer (not shown) can be provided over mass 26 prior to provision of conductive material 236. In the shown embodiment, the second pattern formed within mass 26 comprises both shallow trenches (labeled 240) and deep openings (labeled 238) which extend to pads 14, 16 and 18. The conductive material 236 is formed within the shallow trenches and deep openings.

Figure 7:
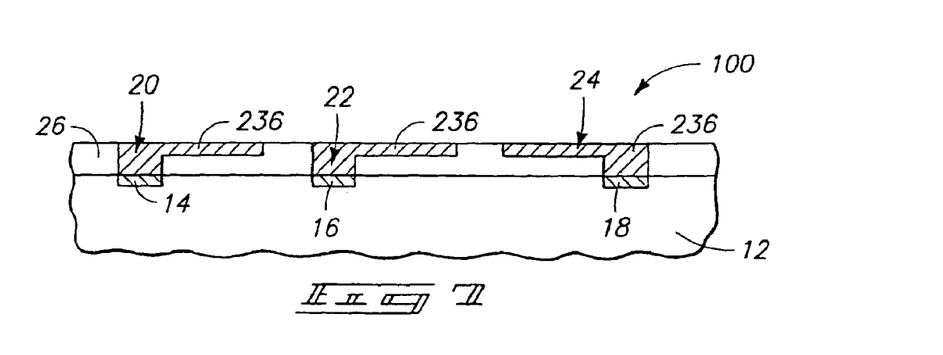
FIG. 7 is a view of the FIG. 2 wafer construction shown at a processing step subsequent to that of FIG. 6.

Referring to FIG. 7, conductive material 236 and mass 26 are together subjected to chemical-mechanical polishing. Such patterns conductive material 236 into redistribution layers 20, 22 and 24. Accordingly, redistribution layers are formed within the trenches and openings that had been created in mass 26 by contact lithography. It is noted that conductive material 236 can comprise an entirety of a redistribution layer, or can comprise only a portion of the redistribution layer. If material 236 is only a portion of a redistribution layer, other portions of the redistribution layer can be formed with techniques other than contact lithography. An advantage of utilizing contact lithography to form at least a portion of a redistribution layer (or other patterned semiconductor component) is that contact lithography can be faster and cheaper than other patterning methods, such as, for example, photolithographic methods.

Figure 8:
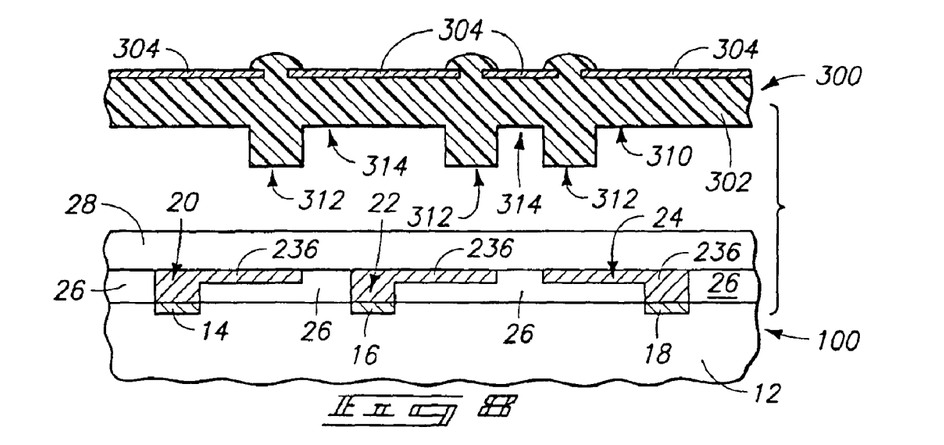
FIG. 8 is a view of the FIG. 2 wafer construction shown at a processing step subsequent to that of FIG. 7, and shown juxtaposed with a second mold.

Referring to FIG. 8, construction 100 is illustrated juxtaposed relative to a second mold 300. Construction 100 is shown at a processing step subsequent to that of FIG. 7, and specifically is shown with an insulative mass 28 formed over redistribution layers 20, 22 and 24, as well as over insulative mass 26. Mass 28 can comprise materials identical to those discussed previously regarding mass 26, such as, for example, CYCLOTENE™.

Mold 300 comprises a construction similar to that discussed previously relative to mold 200 (FIG. 3), and specifically comprises a patterned material 302 and a sheet 304. Material 302 and sheet 304 can be identical in composition to the patterned material 202 and sheet 204 described previously with reference to mold 200. Mold 300 comprises a surface 310 of patterned material 302 which defines a third pattern comprising projections 312 and valleys 314 between the projections. A release layer or lubricant (not shown) can be provided over surface 310.

Figure 9:
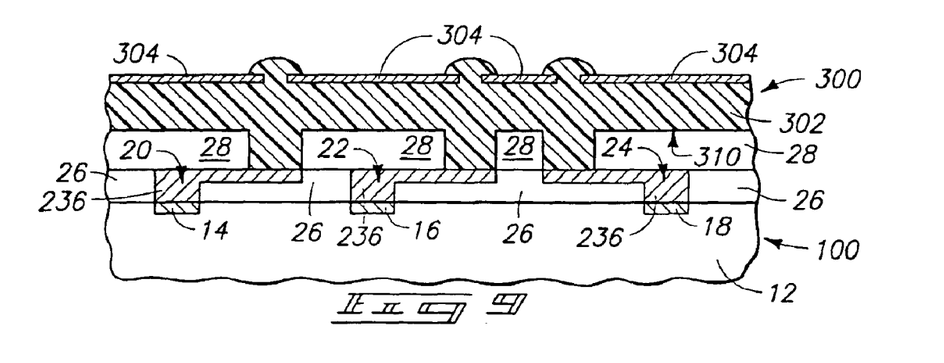
FIG. 9 is a view of the FIG. 2 wafer construction shown at a processing step subsequent to that of FIG. 8, and shown with the FIG. 8 mold pressed into an upper surface of the wafer construction.

Referring to FIG. 9, mold 300 is pressed into mass 28 to pattern mass 28 into a fourth pattern which is substantially complementary to the third pattern defined by surface 310.

Figure 10:
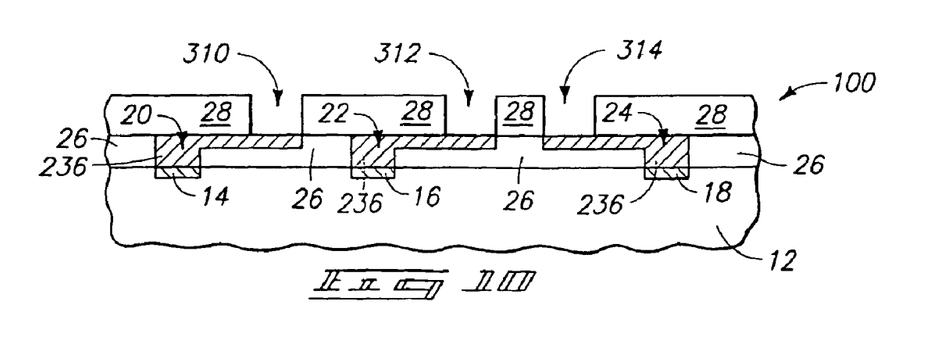
FIG. 10 is a view of the FIG. 2 wafer construction shown at a processing step subsequent to that of FIG. 9.

Referring to FIG. 10, mold 300 (FIG. 9) is removed to leave mass 28 patterned into the fourth pattern. Such fourth pattern comprises openings 310, 312 and 314 extending to redistribution layers 20, 22 and 24, respectively.

Figure 11:
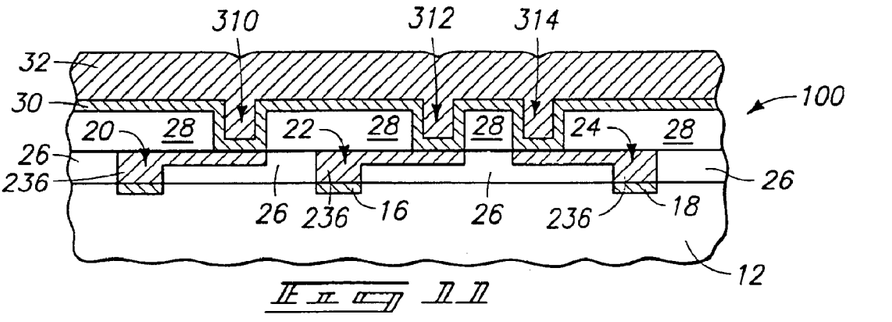
FIG. 11 is a view of the FIG. 2 wafer construction shown a processing step subsequent to that of FIG. 10.

Referring to FIG. 11, conductive materials 30 and 32 are formed across mass 28 and within openings 310, 312 and 314.

Figure 12:
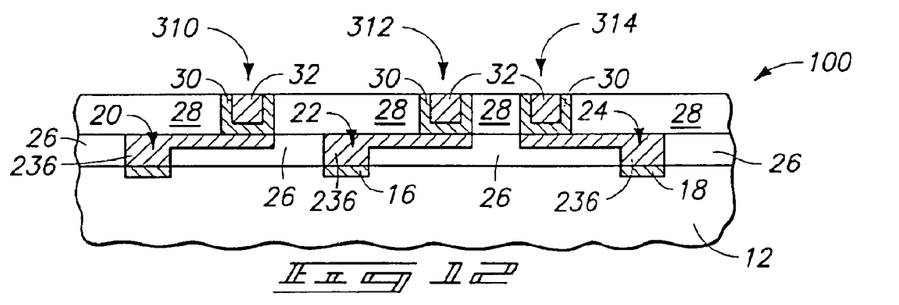
FIG. 12 is a view of the FIG. 2 wafer construction shown at a processing step subsequent to that of FIG. 11.

Referring to FIG. 12, materials 30 and 32 are planarized by, for example, chemical-mechanical polishing and/or appropriate etching to remove the materials from over an upper surface of mass 28 while leaving the materials within openings 310, 312 and 314. Subsequent processing can be conducted to form the under bump materials 34 and 36, and solder bumps 38, described previously with reference to the prior art construction of FIG. 1.

The embodiment described with reference to FIGS. 2–12 is an exemplary embodiment of the present invention, and it is to be understood that the invention encompasses other embodiments in addition to that shown. For instance, although a single mold is shown forming the shallow trenches and deep openings in first masking material 26 (specifically, the mold 200 of FIGS. 3 and 4), it is to be understood that two separate molds could be utilized; with one mold forming the deep openings and another mold forming the shallow trenches.

Figure 13:
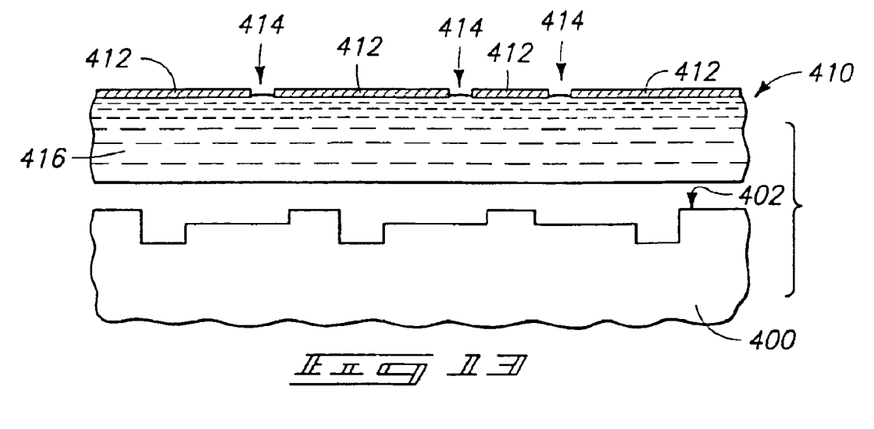

A method for forming a mold suitable for utilization in methodology of the present invention is described with reference to FIGS. 13–15. Referring initially to FIG. 13, a template 400 is provided. Template 400 comprises an upper surface 402 which is patterned into a complement of a desired mold pattern. In other words, surface 402 comprises a reverse image of a desired mold pattern. Template 400 is preferably approximately the size of a semiconductor wafer, and in particular applications can correspond to a semiconductor wafer having an upper surface patterned by conventional photolithography techniques, or by other techniques, such as, for example, ion beam or electron beam technologies. Template 400 is referred to as being "approximately" the size of a semiconductor wafer to indicate that template 400 is preferably at least large enough to encompass all of the patterned region of a semiconductor wafer which is ultimately to be formed by contact lithography, but can have variations in size relative to other portions of the semiconductor wafer without substantially impacting performance aspects of molds formed utilizing the template.

Upper surface 402 can be coated with a suitable lubricant or release layer (not shown), such as, for example, silicone.

A mold construction 410 is illustrated provided above the template 400 at a preliminary step in formation of a patterned mold from the construction. Mold construction 410 comprises a sheet 412 having holes 414 extending therein. Sheet 412 can comprise a substantially rigid material, such as, for example, a metallic material. Sheet 412 preferably comprises some flexibility, however, and accordingly preferably comprises a substantially rigid material which also has flexibility, such as, for example, spring steel. In particular embodiments sheet 412 is about 0.010 inch thick, and is blue tempered spring steel. Sheet 412 can be a rectangle with dimensions of about 24 inches in length by about 12⅜ inches in width. Holes 414 can be, for example, an array of about 0.1 inch diameter holes with a center-to-center spacing of about 0.3 inch. The holes 414 can be formed by, for example, laser etching.

A mold material precursor 416 is provided over a surface of sheet 412. Precursor 416 can comprise, for example, a mixture of the two liquid parts of Dow Corning™ HS II RTV™ High Strength Mold Making Silicone Rubber. Precursor 416 is shown in a liquid state at the processing step of FIG. 13. Precursor 416 is preferably applied onto sheet 412 by a method which forms a flat, uniform coating. Exemplary methods include spin coating, and meniscus spraying with reflow.

Figure 14:
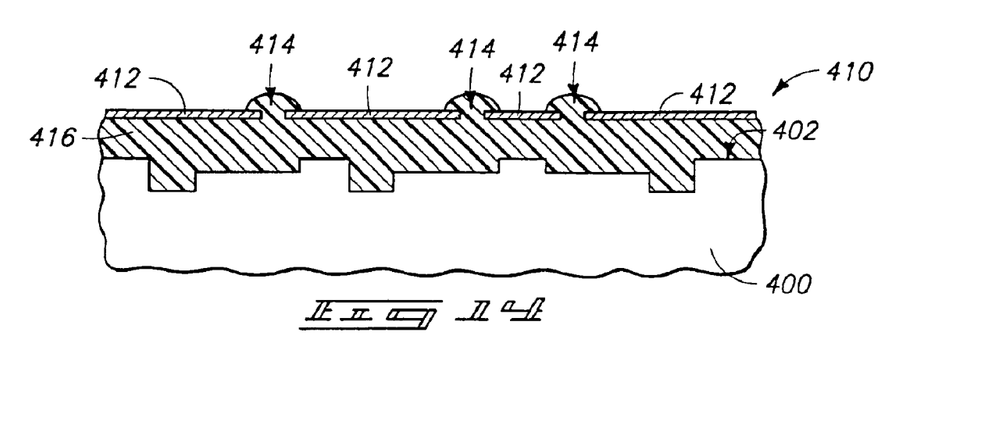
FIG. 14 illustrates the construction of FIG. 13 at a processing step subsequent to that of FIG. 13, and specifically illustrates the mold material of FIG. 13 cured within the FIG. 13 template.

Referring to FIG. 14, mold construction 410 is pressed into template 400, and subsequently precursor 416 is cured to convert the precursor to a patterned mold material. The mold material is preferably smoothly mated with the template to avoid wrinkles or distortion, and pressure is applied while heating the mold material. The cured mold material has a desired mold pattern substantially complementary to the pattern defined by upper surface 402 of template 400. The cured mold material 416 can be a semi-solid material, with the term "semi-solid" indicating that the material has a gelatinous or rubbery texture. It is to be understood, however, that other types of mold material can be utilized in embodiments of the present invention besides patterned materials, including, for example, materials which are non-rubbery solids, including various thermoplastic materials. The thermoplastic materials can be compressed between sheet 412 and template 400, while being heated to an appropriate temperature to melt and flow into the pattern of template 400 and to flow through orifices 414. The thermoplastic material can then be cooled to cure the thermoplastic materials into a desired patterned shape.

The orifices 414 in sheet 412 can allow gases to escape during curing of material 416. In exemplary embodiments, material 416 will cure to form a patterned which is permeable to gases generated during the curing of material 416. Accordingly, the generated gases can penetrate through cured portions of material 416 and subsequently out of orifices 414 to avoid formation of bubbles of the generated gases either within material 416 or at interfaces of material 416 and template 400.

The curing of material 416 can be accomplished while utilizing hot isostatic pressing of mold construction 410 relative to template 400. The pressing is referred to as "hot" pressing to indicate that it occurs above room temperature, and is referred to as "isostatic" to indicate that a pressure remains substantially constant during the curing of the mold material 416. In particular applications, a vacuum can be drawn relative to a shown upper surface of sheet 412 to enhance removal of gases generated during curing of material 416. More specifically, a vacuum can be initially applied, and then chamber 410 can be pressured by atmosphere to obtain an overpressure of several atmospheres which can be maintained to within +/−1 atmosphere during curing of mold material 416.

In a particular aspect of the invention, construction 410 is subjected to evacuation from above and below material 416. The material 416 can then outgas and conform to mold 402 without trapping air. After the material 416 has been allowed to spread and cover an entire portion of the mold 402 that is desired to be covered by material 416, the pressure above construction 410 is raised to at least one atmosphere (14 pounds/square inch) until any voids at the material 416/mold 402 interface are removed. The pressure can be raised higher to compress the still-liquid material 416 into small holes, lines and shapes where the viscosity of material 416 may otherwise preclude filling through surface tension/surface energy effects alone.

Figure 15:
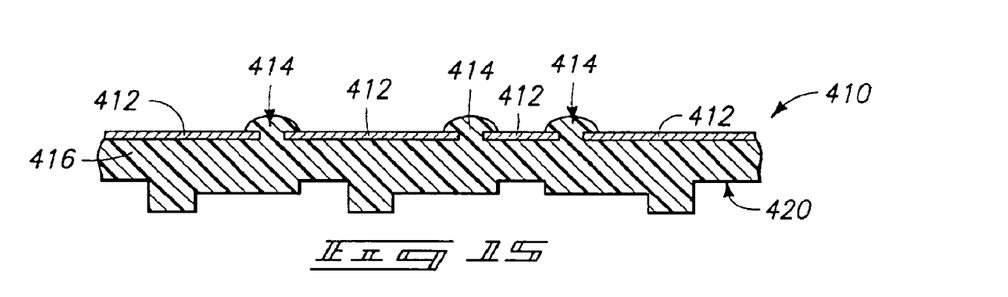
FIG. 15 illustrates a mold at a processing step subsequent to that of FIG. 14, and specifically illustrates the cured mold material of FIG. 14 removed from the FIG. 14 template.

FIG. 15 illustrates mold construction 410 removed from template 400 (FIG. 14) after curing of mold material 416. Cured material 416 has an illustrated lower surface 420 which defines a pattern substantially complementary to the upper surface 402 (FIG. 14) of template 400. The cured mold material 416 is illustrated penetrating through openings 414 and extending across an illustrated upper surface of sheet 412. Accordingly, sheet 412 is grasped within cured mold material 416 so that sheet 412 and material 416 effectively together form a robust single mold unit. The robustness (i.e., durability) of the mold unit can be further enhanced if material 416 chemically interacts with sheet 412 to bond with the material of sheet 412.

A difficulty which can be encountered in utilization of contact lithography occurs in aligning a mold pattern relative to either a template utilized to generate the pattern, or a semiconductor wafer substrate upon which the pattern is to be imprinted. Exemplary methodology for aligning a mold relative to a substrate is described with reference to FIGS. 16–21.

Figure 16:
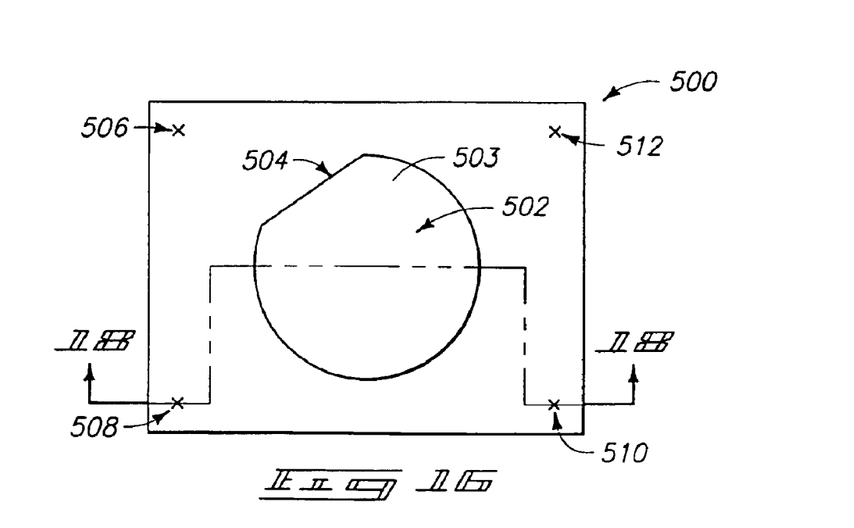
FIG. 16 illustrates a top view of a wafer holding apparatus which can be utilized in methodology of the present invention.

Referring initially to FIG. 16, a semiconductor substrate holder 500 is illustrated. Holder 500 comprises a receptacle 502 configured for receiving a semiconductor wafer, and in the shown embodiment a wafer 503 is retained within the receptacle. Receptacle 502 comprises a generally circular shape with a flat region 504, and accordingly in the shown embodiment is configured to mate tightly with semiconductor wafers which are themselves circular about a majority of the periphery and comprise a flat portion. It is to be understood that receptacle 502 can comprise other shapes, depending on the shapes of wafers which are to be held within holder 500. Preferably, receptacle 502 will be configured to tightly retain semiconductor wafers in a reproducible orientation relative to holder 500. It is noted that receptacle 502 can be replaced with other retaining means configured to retain semiconductor wafers in particular, reproducible orientations relative to holder 500.

Substrate holder 500 is shown comprising a rectangular configuration, but it is to be understood that holder 500 can comprise other shapes in other embodiments of the invention which are not shown.

A plurality of alignment regions 506, 508, 510 and 512 are shown within substrate holder 500. Although four alignment regions are shown, it is to be understood that the invention encompasses other embodiments wherein more than four alignment regions, or less than four alignment regions, are utilized. Alignment regions 506, 508, 510 and 512 comprise alignment articles which ultimately are utilized for aligning substrate holder 500 relative to a mold. Such alignment articles can correspond to, for example, markings utilized for optical alignment, or components of a mechanical alignment system. An exemplary mechanical alignment system is a system wherein pins are provided as an alignment article associated with either substrate holder 500 or with a mold, receptacles are provided with the other of substrate 500 and the mold, and subsequently the pins are inserted into the receptacles to align the substrate holder with the mold.

Figure 17:
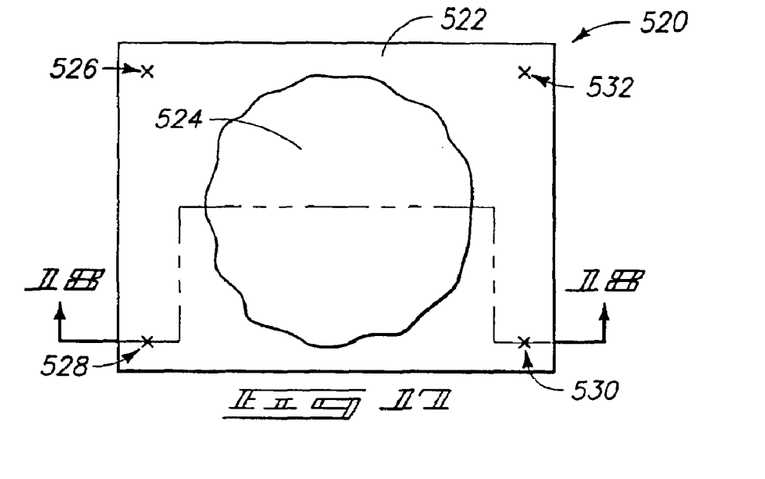
FIG. 17 illustrates a top view of a mold apparatus which can be utilized in methodology of the present invention.

Referring to FIG. 17, a mold 520 is illustrated. Mold 520 comprises a substantially rigid sheet 522 and a patterned material 524 joined to sheet 522. Material 524 can be identical to the material 416 described with reference to FIG. 15, and sheet 522 can be identical to the sheet 412 described with reference to FIG. 15. A plurality of alignment regions 526, 528, 530 and 532 are defined relative to mold 520. Alignment regions 526, 528, 530 and 532 comprise alignment articles which ultimately are utilized for aligning mold 520 with the substrate holder 500 of FIG. 16. Alignment articles 526, 528, 530 and 532 can comprise optical alignment articles, such as, for example, transparent windows having markings thereon which are ultimately aligned with markings corresponding to alignment articles on substrate holder 500. Alternatively, the alignment articles associated with mold 520 can comprise mechanical alignment articles, such as, for example, either pins or receptacle configured to align with mechanical alignment articles associated with substrate holder 500.

Figure 18:
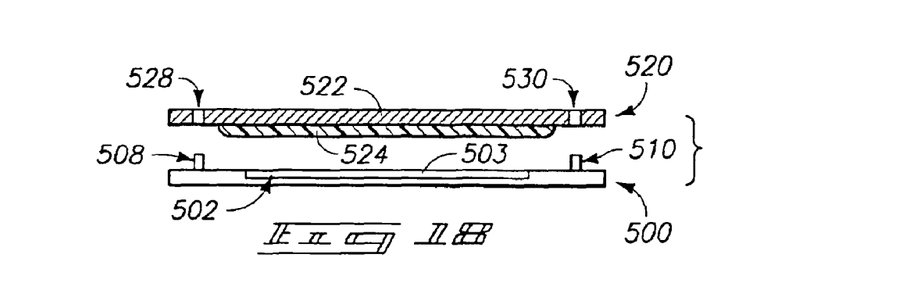
FIG. 18 illustrates the mold apparatus of FIG. 17 juxtaposed relative to the wafer holding apparatus of FIG. 16, with the apparatuses of FIGS. 16 and 17 shown in cross-sectional view in FIG. 18 along the lines 18—18 of FIGS. 16 and 17. The mold apparatus is shown in an inverted view in FIG. 18 relative to the view in FIG. 17.

FIG. 18 shows a cross-sectional view of substrate holder 500 juxtaposed relative to mold 520, and illustrates an embodiment wherein alignment articles 508 and 510 correspond to pins, and alignment articles 528 and 530 correspond to receptacles. Accordingly, mold 520 is aligned relative to substrate holder 500 by inserting pins 508 and 510 into receptacles 528 and 530. After such alignment, mold 520 can be pressed relative to substrate holder 500 to force material 524 into a layer (not shown) associated with the semiconductor wafer 503 retained in holder 500 to imprint a pattern from material 524 into the layer. Further, substrate holder 500 can be utilized during formation of a mold by placing a template within receiving orifice 502, and subsequently aligning a mold 520 relative to substrate holder 500 to press uncured mold material precursor against the template and retain the precursor in an aligned orientation relative to the template during curing of the precursor.

Although the alignment articles of FIG. 18 are shown as particular pins and receptacles, it is to be understood that the alignment articles can have other geometric configurations. For instance, it can be desired to use shapes different than the shown pins to reduce alignment tolerances. In some applications, it may be desired that the pins be as large as is physically possible relative to the receptacles to ensure a tight fit and substantially minimum tolerances.

Figure 19:
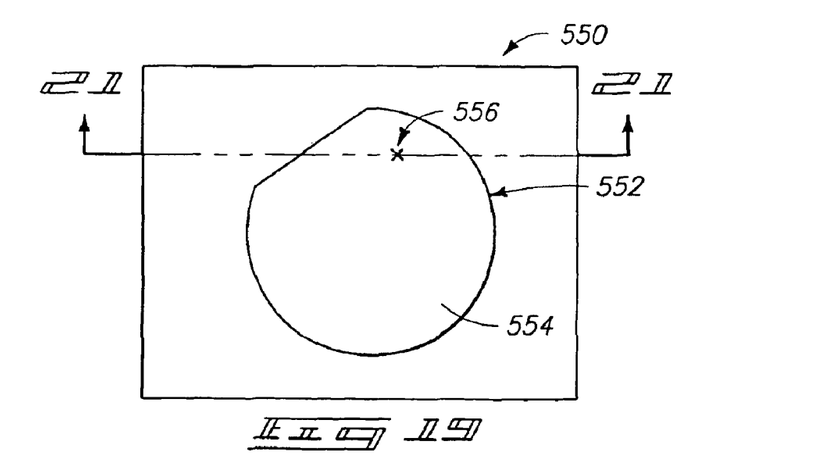
FIG. 19 illustrates a top view of another embodiment of a wafer holder which can be utilized in accordance with methodology of the present invention.
Figure 20:
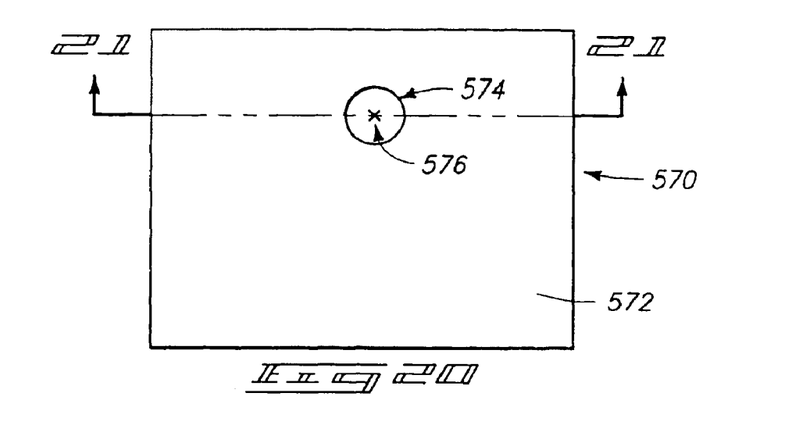
FIG. 20 illustrates a bottom view of a second embodiment mold which can be utilized in methodology of the present invention.
Figure 21:
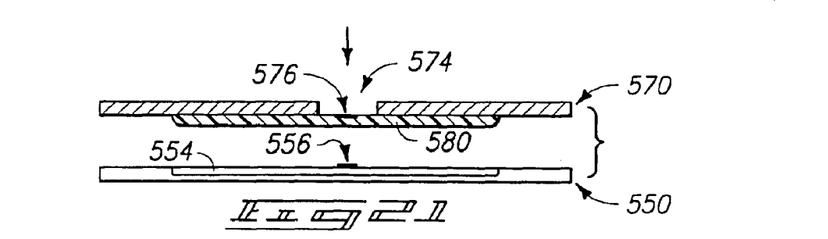
FIG. 21 illustrates the mold of FIG. 20 juxtaposed relative to the wafer holding apparatus of FIG. 19, and shows the FIG. 20 mold and FIG. 19 wafer holding apparatus in cross-sectional view. The cross-sections of FIG. 21 are along the lines 21—21 in FIGS. 19 and 20.

FIGS. 19–21 illustrate an alternative method of aligning a substrate relative to a mold. Referring initially to FIG. 19, a substrate holder 550 is illustrated. Substrate holder 550 comprises a receptacle 552 configured for retaining a semiconductor substrate, and a substrate 554 shown within the receptacle. Substrate 554 comprises an alignment pattern 556 associated therewith. Alignment pattern 556 can comprise, for example, an optical alignment pattern, such as, for example, a diffraction grating.

FIG. 20 illustrates a mold 570 comprising a sheet 572. Mold 570 also comprises a patterned material 580 (FIG. 21) analogous to the material 524 described with reference to FIG. 17. However, the view of FIG. 20 is from an opposing side relative to the view of FIG. 17, and accordingly, the patterned mold material is on a backside surface of mold 570 which is not shown in the view of FIG. 20. Mold 570 comprises a window 574 extending through sheet 572. In the shown embodiment, the patterned mold material 580 (FIG. 21) is transparent, and comprises an optical alignment marking 576 associated therewith. Alignment pattern 576 can comprise, for example, a diffraction grating.

FIG. 21 illustrates substrate holder 550 and mold 570 in cross-sectional view and juxtaposed relative to one another. Alignment pattern 556 can be viewed through window 574 and transparent mold material 580, and accordingly optical alignment patterns 556 and 576 can be aligned relative to one another to enable alignment of mold 570 relative to the semiconductor substrate 554.

In particular embodiments, the mechanical alignment methodology of FIG. 18 can be used in conjunction with the optical alignment of FIG. 21. In such embodiments pin alignment can be used to get a wafer holder and mold close to a final alignment (i.e. can be utilized for coarse alignment adjustment), and subsequently optical alignment can be utilized to improve the alignment of the wafer substrate and mold (i.e. can be utilized for fine alignment adjustment).

Figure 22:
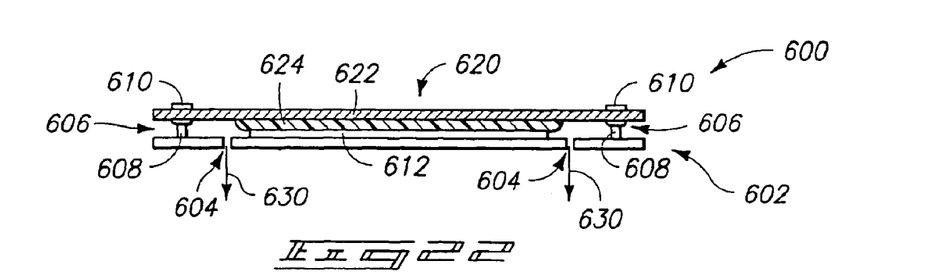
FIG. 22 illustrates an apparatus which can be utilized for contact lithography in accordance with methodology of the present invention.
Figure 23:
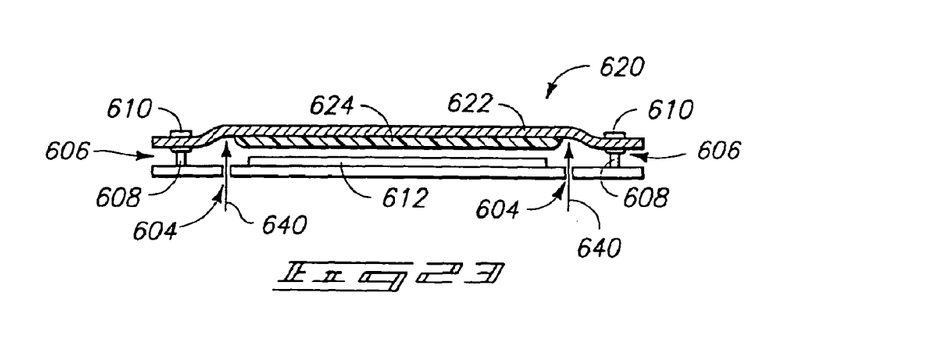
FIG. 23 illustrates the FIG. 22 apparatus at a processing step subsequent to that of FIG. 22.

Contact lithographic methodology of the present invention can comprise any suitable method of compression of a mold and a wafer substrate. FIGS. 22 and 23 illustrate exemplary methodology which can be utilized for pressing a mold against a semiconductor substrate, and subsequently releasing the mold form the semiconductor substrate. Specifically, FIG. 22 illustrates an apparatus 600 comprising a substrate holder 602 having orifices 604 formed therethrough, and clamps 606 associated therewith. A semiconductor wafer substrate 612 is retained within holder 602. Clamps 606 comprises portions 608 and 610. A mold 620 comprises a sheet 622 and a patterned mold material 624, with the sheet 622 retained within clamps 606. A gasket (not shown) can be provided between the clamps and the sheet 622, with a suitable gasket material being neoprene. In other embodiments (not shown), clamps 606 can be eliminated and replaced with a neoprene gasket material upon which sheet 622 is rested. An entirety of the assembly of FIG. 23 can be less than or equal to ⅛ inch thick.

In operation a vacuum (illustrated by downwardly extending arrows 630) is drawn through orifices 604 to pull patterned mold material 624 onto a surface of substrate 612. The vacuum can be pulled to apply a uniform pressure of about 14 pounds/in$^2$ between the mold and the substrate.

Referring to FIG. 23, mold 620 is released from substrate 612 by flowing pressure through orifices 604 (illustrated by upwardly extending arrows 640), which causes a central portion of mold 620 to lift from substrate 612. It is noted that removal of a patterned material from over a semiconductor substrate can be problematic, in that the patterned material can stick to the semiconductor substrate. Methodology of the present invention can form a small break between the patterned material and the semiconductor substrate at an edge as pressure is applied, and then propagate the break across a central region of the patterned material and substrate to release the patterned material from the substrate.

An advantage of utilizing a flexible material for sheet 622 is evident in FIGS. 22 and 23. Specifically, such flexible material can enable sheet 622 to flex during the pull of a vacuum (illustrated in FIG. 22) so that patterning material 624 is pulled into a surface of substrate 612; and further a flexible sheet 622 can enable the mold 624 to flex during introduction of pressure (illustrated in FIG. 23) so that the pattern material 624 is lifted from substrate 612 to simplify removal of the substrate.

Although the contact lithography of the present invention is described above with reference to an exemplary process of forming a pattern in a dielectric material during fabrication of a redistribution layer, it is to be understood that the invention encompasses other utilizations of contact lithography in addition to the specifically described embodiment. For instance, the invention encompasses other applications of contact lithography to semiconductor fabrication processes.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A mold configured to pattern a mass over a semiconductor substrate during contact lithography of the mass, and comprising:

a substantially rigid sheet having holes extending therethrough; and a patterned material joined to the sheet, the patterned material extending through the holes in the sheet, the patterned material having a pattern therein which is a reverse image of a pattern which is to be formed in the mass during contact lithography.

2. The mold of claim 1 wherein the patterned material is a thermoplastic material.

3. The mold of claim 1 wherein the patterned material is a Semi-solid material.

4. The mold of claim 1 wherein the patterned material is a cured siloxane material.

5. The mold of claim 1 wherein the patterned material is a cured silicone rubber material.

6. The mold of claim 1 wherein the sheet is metallic.

7. The mold of claim 1 wherein the sheet is spring steel.

8. The mold of claim 1 wherein the sheet has an alignment article associated therewith and configured to align the mold with the semiconductor substrate during the contact lithography.

9. The mold of claim 1 wherein the pattern in the patterned material corresponds to a reverse image of at least a portion of a redistribution layer.

* * * * *

UNITED STATES PATENT AND TRADEMARK OFFICE
CERTIFICATE OF CORRECTION

PATENT NO.       : 6,989,595 B2                                         Page 1 of 1
APPLICATION NO.  : 10/461811
DATED            : January 24, 2006
INVENTOR(S)      : Hofmann It is certified that error appears in the above-identified patent and that said Letters Patent is hereby corrected as shown below:

Col. 3, line 24, please insert --at-- before "a".

Col. 4, line 14, please delete "of" after "consist".

Col. 9, line 48, please delete "form" after "mold" and insert --from--.

Col. 10, line 53, claim 3, please delete "Semi-solid" after "a" and insert --semi-solid--.

Signed and Sealed this

Tenth Day of April, 2007

JON W. DUDAS
*Director of the United States Patent and Trademark Office*